United States Patent
Haley et al.

(10) Patent No.: US 12,219,691 B2
(45) Date of Patent: Feb. 4, 2025

(54) PRINTED CIRCUIT BOARD ASSEMBLY WITH INTEGRATED VAPOR CHAMBER

(71) Applicant: NVIDIA CORPORATION, Santa Clara, CA (US)

(72) Inventors: David Haley, Beaverton, OR (US); James Stephen Fields, Jr., Santa Fe, NM (US); Seungkug Park, San Jose, CA (US)

(73) Assignee: NVIDIA CORPORATION, Santa Clara, CA (US)

( * ) Notice: Subject to any disclaimer, the term of this patent is extended or adjusted under 35 U.S.C. 154(b) by 68 days.

(21) Appl. No.: 17/728,731

(22) Filed: Apr. 25, 2022

(65) Prior Publication Data

US 2023/0345613 A1 Oct. 26, 2023

(51) Int. Cl.
*H05K 1/02* (2006.01)
*G06F 1/20* (2006.01)
*H05K 1/18* (2006.01)

(52) U.S. Cl.
CPC ............ *H05K 1/0203* (2013.01); *G06F 1/20* (2013.01); *H05K 1/181* (2013.01)

(58) Field of Classification Search
CPC ......... H01L 23/427; H01L 2924/15153; H01L 2023/405; H05K 7/20336; H05K 1/181; H05K 7/209; H05K 2201/066; H05K 1/0203; H05K 1/0204; H05K 1/0272; H05K 2201/064; H05K 7/20254; H05K 7/20281; G06F 1/20; G06F 1/206; G06F 2200/201; F28C 3/02; F28C 3/12; F28C 3/08
See application file for complete search history.

(56) References Cited

U.S. PATENT DOCUMENTS

| | | | |
|---|---|---|---|
| 6,665,187 B1 * | 12/2003 | Alcoe | H01L 23/427 257/E23.101 |
| 10,943,851 B1 * | 3/2021 | Elsherbini | H01L 25/0652 |
| 2003/0020142 A1 * | 1/2003 | Wachtler | H01L 21/6835 257/620 |
| 2003/0168203 A1 * | 9/2003 | Gektin | F28F 23/00 257/E23.09 |
| 2004/0057214 A1 * | 3/2004 | Alcoe | H01L 23/42 257/E23.101 |
| 2005/0274487 A1 * | 12/2005 | Goth | F28F 9/001 257/E23.088 |
| 2012/0098119 A1 * | 4/2012 | Refai-Ahmed | H01L 25/115 438/109 |
| 2014/0134804 A1 * | 5/2014 | Kelly | H01L 23/481 438/118 |
| 2014/0240918 A1 * | 8/2014 | Damaraju | H01L 23/427 165/104.21 |
| 2015/0132892 A1 * | 5/2015 | Hung | H01L 24/11 438/113 |
| 2018/0143671 A1 * | 5/2018 | Lee | G06F 1/20 |
| 2019/0323785 A1 * | 10/2019 | Eid | H01L 25/0652 |
| 2019/0385929 A1 * | 12/2019 | Ku | H01L 25/0655 |
| 2020/0006181 A1 * | 1/2020 | Chen | H01L 25/0657 |
| 2020/0091036 A1 * | 3/2020 | Chen | H01L 24/32 |

(Continued)

*Primary Examiner* — Michael A Matey

(74) *Attorney, Agent, or Firm* — Artegis Law Group, LLP

(57) ABSTRACT

A printed circuit board assembly comprises: a printed circuit board (PCB); an integrated circuit (IC) package that is mounted on the PCB and includes a first surface and a bare IC die disposed on the first surface; and a vapor chamber coupled to the first surface of the IC package.

17 Claims, 5 Drawing Sheets

(56) References Cited

U.S. PATENT DOCUMENTS

| | | | |
|---|---|---|---|
| 2020/0203254 A1* | 6/2020 | Dhane | H01L 23/473 |
| 2020/0350229 A1* | 11/2020 | Chang | H01L 23/3733 |
| 2021/0015003 A1* | 1/2021 | Chen | F28D 15/04 |
| 2021/0043537 A1* | 2/2021 | Faneuf | G11C 5/06 |
| 2021/0104448 A1* | 4/2021 | Eid | H01L 23/427 |
| 2021/0193548 A1* | 6/2021 | Wan | H01L 23/3121 |
| 2021/0195798 A1* | 6/2021 | Neal | H01L 23/3675 |
| 2021/0208647 A1* | 7/2021 | Macias | G06F 1/184 |
| 2021/0257272 A1* | 8/2021 | Kothari | H01L 23/3736 |
| 2021/0320048 A1* | 10/2021 | Limaye | H01L 23/427 |
| 2021/0410329 A1* | 12/2021 | Yang | H05K 7/20254 |
| 2022/0113773 A1* | 4/2022 | Ma | H05K 7/20809 |
| 2022/0174843 A1* | 6/2022 | Geng | H05K 7/20418 |
| 2023/0253288 A1* | 8/2023 | Adebiyi | H01L 25/0655 |
| | | | 257/687 |

* cited by examiner

PRINTED CIRCUIT BOARD ASSEMBLY WITH INTEGRATED VAPOR CHAMBER

BACKGROUND

Field of the Various Embodiments

The various embodiments relate generally to computer systems and computer architecture and, more specifically, to a printed circuit board assembly with integrated vapor chamber.

DESCRIPTION OF THE RELATED ART

Printed circuit boards (PCBs) enable the integration of multiple electronic components, such as separately packaged integrated circuits (ICs), capacitors, resistors, voltage regulators, and the like, into a single compact assembly. Such assemblies oftentimes are referred to as printed circuit board assemblies (PCBAs) and are used in a wide range of communication and computing implementations, including, without limitation, mobile phones, laptop computers, desktop computers, and server machines.

In high-performance implementations, such as graphics cards and server machines, certain electronic components of a PCBA can generate significant heat during operation. To prevent over-heating, the generated heat has to be transferred away from the PCBA. Accordingly, in practice, many high-performance PCBAs include, or are coupled, to a heat sink, cold plate, or other thermal solution that greatly increases the amount of heat transfer away from the PCBA. Typically, the thermal solution is a heat transfer apparatus that is mounted on a PCBA such that a cooling surface of the thermal solution is coupled to a heat-generating component of the PBCA, such as a high-power IC. In such a configuration, the thermal solution transfers heat directly away from the heat-generating component.

Many heat-generating components that are included in PCBAs are very fragile and can be damaged when coupled to a thermal solution during assembly. For example, PCBAs often include packaged ICs, such as a graphics processing unit (GPU) or a central processing unit (CPU). A CPU or GPU is typically a single, large processor die that is a fraction of a millimeter thick and includes millions of microscopic transistors. Because of the relatively large surface area and limited thickness of these types of processor dies, even a slight deflection of, or accidental contact with, a given die when attaching the thermal solution can cause substantial damage to the processor die. Further, modern processor dies oftentimes are packaged with other, even more delicate ICs, such as high-bandwidth memory (HBM) devices. Consequently, packages for processing dies and other ICs are commonly "lidded" packages, which include a lid that fully encases and protects the various IC dies within the package.

One drawback to conventional lidded IC packages is that the thermal performance of the thermal solution coupled to the lidded package is typically reduced. More specifically, the presence of the lid in between a heat-generating die within the lidded package and the thermal solution increases overall thermal resistance, thereby resulting in less effective heat transfer from the heat-generating die to the thermal solution. Alternatively, higher thermal performance can be achieved when an unlidded IC package is included in a PCBA, and the thermal solution is coupled directly to the unlidded IC package, for example, via a thermal interface material. However, as noted above, an unlidded IC package offers limited protection to the die or dies included in the IC package, thereby increasing the likelihood of any such die being damaged when the thermal solution is coupled to the IC package.

As the foregoing illustrates, what is needed in the art are more effective ways to couple thermal solutions to integrated circuits.

SUMMARY

A printed circuit board assembly comprises: a printed circuit board (PCB); an integrated circuit (IC) package that is mounted on the PCB and includes a first surface and a bare IC die disposed on the first surface; and a vapor chamber coupled to the first surface of the IC package.

At least one technical advantage of the disclosed design relative to the prior art is that the disclosed design enables a thermal solution to be coupled to a PCBA that includes an unlidded IC package without the risk of damaging ICs within the unlidded IC package. Because the vapor chamber is coupled to the unlidded IC package during assembly of the PCBA, ICs within the unlidded IC package are protected in subsequent manufacturing processes. For example, during assembly of a server machine that includes such a PCBA, IC's within the unlidded IC package are protected from damage while the PCBA is manipulated, coupled to a thermal solution, and installed within the server machine. Thus, with the disclosed design, ICs within an unlidded IC package can have as much protection during server machine assembly as ICs within a lidded IC package. Further, with the disclosed design there is no increase in thermal resistance caused by a lid being disposed between the ICs and the thermal solution. These technical advantages provide one or more technological advancements over prior art approaches.

BRIEF DESCRIPTION OF THE DRAWINGS

So that the manner in which the above recited features of the various embodiments can be understood in detail, a more particular description of the inventive concepts, briefly summarized above, may be had by reference to various embodiments, some of which are illustrated in the appended drawings. It is to be noted, however, that the appended drawings illustrate only typical embodiments of the inventive concepts and are therefore not to be considered limiting of scope in any way, and that there are other equally effective embodiments.

For clarity, identical reference numbers have been used, where applicable, to designate identical elements that are common between figures. It is contemplated that features of one embodiment may be incorporated in other embodiments without further recitation.

DETAILED DESCRIPTION

In the following description, numerous specific details are set forth to provide a more thorough understanding of the various embodiments. However, it will be apparent to one of skill in the art that the inventive concepts may be practiced without one or more of these specific details.

System Overview

Figure 1:
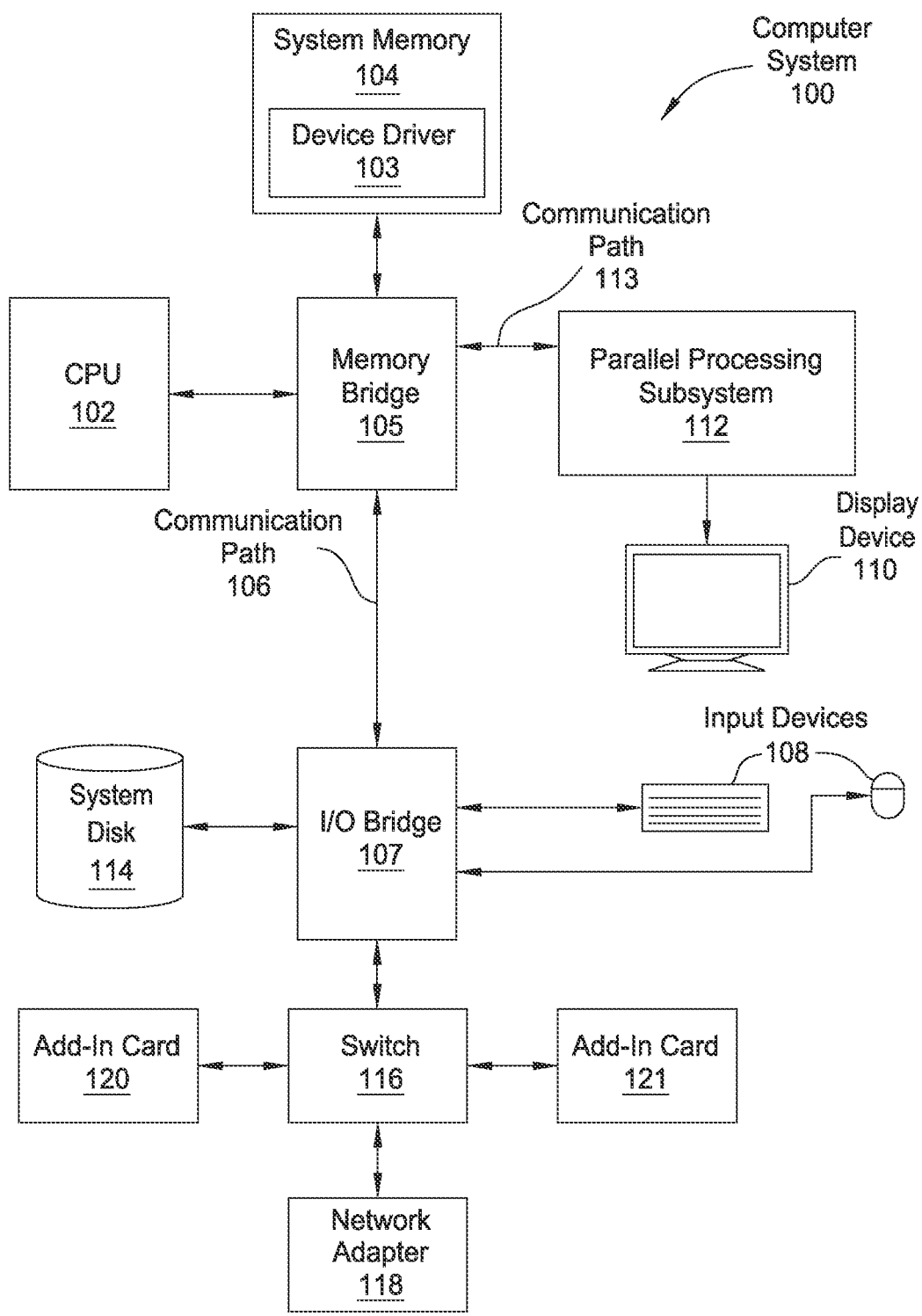
FIG. 1 is a conceptual illustration of a computer system configured to implement one or more aspects of the various embodiments.

FIG. 1 is a conceptual illustration of a computer system 100 configured to implement one or more aspects of the various embodiments. As shown, computer system 100 includes a central processing unit (CPU) 102 and a system memory 104 communicating via a bus path that may include a memory bridge 105. CPU 102 includes one or more processing cores, and, in operation, CPU 102 is the master processor of computer system 100, controlling and coordinating operations of other system components. System memory 104 stores software applications and data for use by CPU 102. CPU 102 runs software applications and optionally an operating system. Memory bridge 105, which may be, e.g., a Northbridge chip, is connected via a bus or other communication path (e.g., a HyperTransport link) to an I/O (input/output) bridge 107. I/O bridge 107, which may be, e.g., a Southbridge chip, receives user input from one or more user input devices 108 (e.g., keyboard, mouse, joystick, digitizer tablets, touch pads, touch screens, still or video cameras, motion sensors, and/or microphones) and forwards the input to CPU 102 via memory bridge 105.

A parallel processing subsystem 112 is coupled to memory bridge 105 via a bus or other communication path (e.g., a PCI Express, Accelerated Graphics Port, or HyperTransport link); in one embodiment parallel processing subsystem 112 is a graphics subsystem that includes at least one graphics processing unit (GPU) and graphics memory. Graphics memory includes a display memory (e.g., a frame buffer) used for storing pixel data for each pixel of an output image. Graphics memory can be integrated in the same device as the GPU, connected as a separate device with the GPU, and/or implemented within system memory 104.

Parallel processing subsystem 112 periodically delivers pixels to a display device 110 (e.g., a screen or conventional CRT, plasma, OLED, SED or LCD based monitor or television). Additionally, parallel processing subsystem 112 may output pixels to film recorders adapted to reproduce computer generated images on photographic film. Parallel processing subsystem 112 can provide display device 110 with an analog or digital signal. In various embodiments, a graphical user interface is displayed to one or more users via display device 110, and the one or more users can input data into and receive visual output from the graphical user interface.

A system disk 114 is also connected to I/O bridge 107 and may be configured to store content and applications and data for use by CPU 102 and parallel processing subsystem 112. System disk 114 provides non-volatile storage for applications and data and may include fixed or removable hard disk drives, flash memory devices, and CD-ROM, DVD-ROM, Blu-ray, HD-DVD, or other magnetic, optical, or solid state storage devices.

A switch 116 provides connections between I/O bridge 107 and other components such as a network adapter 118 and various add-in cards 120 and 121. Network adapter 118 allows computer system 100 to communicate with other systems via an electronic communications network, and may include wired or wireless communication over local area networks and wide area networks such as the Internet.

Other components (not shown), including USB or other port connections, film recording devices, and the like, may also be connected to I/O bridge 107. For example, an audio processor may be used to generate analog or digital audio output from instructions and/or data provided by CPU 102, system memory 104, or system disk 114. Communication paths interconnecting the various components in FIG. 1 may be implemented using any suitable protocols, such as PCI (Peripheral Component Interconnect), PCI Express (PCI-E), AGP (Accelerated Graphics Port), HyperTransport, or any other bus or point-to-point communication protocol(s), and connections between different devices may use different protocols, as is known in the art.

In one embodiment, parallel processing subsystem 112 incorporates circuitry optimized for graphics and video processing, including, for example, video output circuitry, and constitutes a graphics processing unit (GPU). In another embodiment, parallel processing subsystem 112 incorporates circuitry optimized for general purpose processing. In yet another embodiment, parallel processing subsystem 112 may be integrated with one or more other system elements, such as the memory bridge 105, CPU 102, and I/O bridge 107 to form a system on chip (SoC). In still further embodiments, parallel processing subsystem 112 is omitted and software executed by CPU 102 performs the functions of parallel processing subsystem 112.

Pixel data can be provided to parallel processing subsystem 112 directly from CPU 102. In some embodiments, instructions and/or data representing a scene are provided to a render farm or a set of server computers, each similar to computer system 100, via network adapter 118 or system disk 114. The render farm generates one or more rendered images of the scene using the provided instructions and/or data. These rendered images may be stored on computer-readable media in a digital format and optionally returned to computer system 100 for display. Similarly, stereo image pairs processed by parallel processing subsystem 112 may be output to other systems for display, stored in system disk 114, or stored on computer-readable media in a digital format.

Alternatively, CPU 102 provides parallel processing subsystem 112 with data and/or instructions defining the desired output images, from which parallel processing subsystem 112 generates the pixel data of one or more output images, including characterizing and/or adjusting the offset between stereo image pairs. The data and/or instructions defining the desired output images can be stored in system memory 104 or graphics memory within parallel processing subsystem 112. In an embodiment, parallel processing subsystem 112 includes 3D rendering capabilities for generating pixel data for output images from instructions and data defining the geometry, lighting shading, texturing, motion, and/or camera parameters for a scene. Parallel processing subsystem 112 can further include one or more programmable execution units capable of executing shader programs, tone mapping programs, and the like.

Further, in other embodiments, CPU 102 or parallel processing subsystem 112 may be replaced with or supplemented by any technically feasible form of processing device configured process data and execute program code. Such a processing device could be, for example, a central processing unit (CPU), a graphics processing unit (GPU), an application-specific integrated circuit (ASIC), a field-programmable gate array (FPGA), and so forth. In various embodiments any of the operations and/or functions described herein can be performed by CPU 102, parallel processing subsystem 112, or one or more other processing devices or any combination of these different processors.

CPU 102, a render farm, and/or parallel processing subsystem 112 can employ any surface or volume rendering technique known in the art to create one or more rendered images from the provided data and instructions, including rasterization, scanline rendering REYES or micropolygon rendering, ray casting, ray tracing, image-based rendering techniques, and/or combinations of these and any other rendering or image processing techniques known in the art.

In other contemplated embodiments, computer system 100 may or may not include other elements shown in FIG. 1. System memory 104 and/or other memory units or devices in computer system 100 may include instructions that, when executed, cause the robot or robotic device represented by computer system 100 to perform one or more operations, steps, tasks, or the like.

It will be appreciated that the computer system shown herein is illustrative and that variations and modifications are possible. The connection topology, including the number and arrangement of bridges, may be modified as desired. For instance, in some embodiments, system memory 104 is connected to CPU 102 directly rather than through a bridge, and other devices communicate with system memory 104 via memory bridge 105 and CPU 102. In other alternative topologies parallel processing subsystem 112 is connected to I/O bridge 107 or directly to CPU 102, rather than to memory bridge 105. In still other embodiments, I/O bridge 107 and memory bridge 105 might be integrated into a single chip. The particular components shown herein are optional; for instance, any number of add-in cards or peripheral devices might be supported. In some embodiments, switch 116 is eliminated, and network adapter 118 and add-in cards 120, 121 connect directly to I/O bridge 107.

Exemplar Computer System

Figure 2:
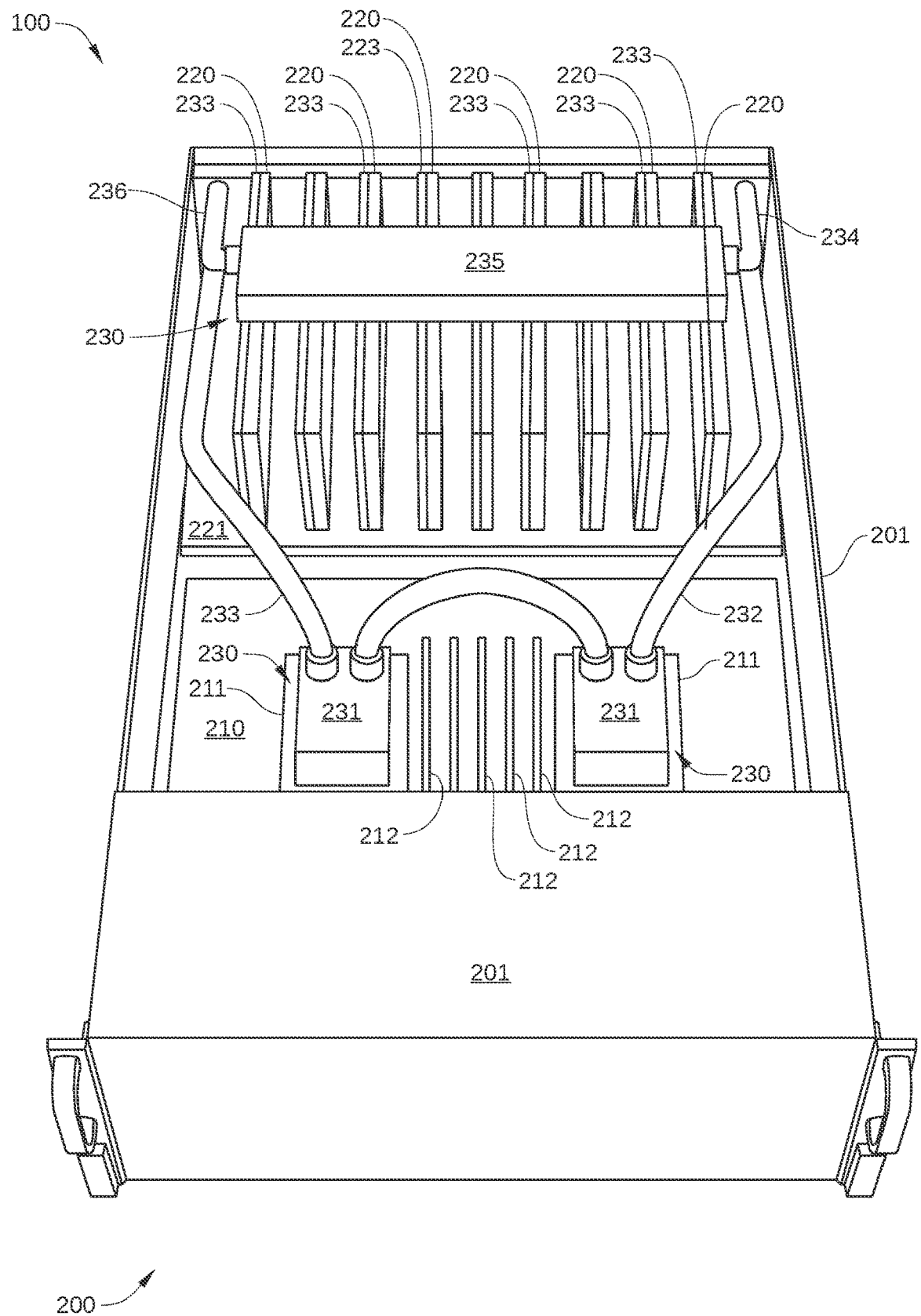
FIG. 2 illustrates an exemplar implementation of the computer system of FIG. 1, according to various embodiments.

FIG. 2 illustrates an exemplar implementation of computer system 100 of FIG. 1, according to various embodiments. In the embodiment illustrated in FIG. 2, computer system 100 is configured as a server machine 200 that provides data, services, programs, computing resources, and/or other resources to a plurality of client computers (not shown) over a network. For example, in some embodiments, server machine 200 is configured as a rack-mounted system that can be installed in a server rack. As such, server machine 200 includes a server motherboard 210 and/or one or more graphics cards 220, which are disposed within an enclosure 201.

Server motherboard 210 enables communication between various electronic components of server machine 200, such as one or more central processing units (CPUs) 211 (dashed lines) and memory devices 212. In some embodiments, memory devices 212 include dual in-line memory modules (DIMMs) and/or single in-line memory modules (SIMMs). In the embodiment illustrated in FIG. 2, server motherboard 210 has two CPUs 211 mounted thereon, and is configured with a plurality of memory devices 212. Alternatively, in some embodiments, server motherboard 210 has more than or fewer than two CPUs 211 mounted thereon. In either case, in some embodiments, server motherboard 200 can be a printed circuit board assembly (PCBA) that is configured according to various embodiments described herein.

Each graphics card 220 includes a GPU (not shown) and is configured to enable server machine to perform diverse artificial intelligence (AI), high-performance computing (HPC), and accelerated computing workloads. In the embodiment illustrated in FIG. 2, server machine 200 includes nine graphics cards 220, for example mounted on a backplane 221. Alternatively, in some embodiments, graphics card 220 has more than or fewer than nine graphics cards 220 mounted thereon. In some embodiments, each graphics card 220 can be a printed circuit board assembly (PCBA) that is configured according to various embodiments described herein.

Alternatively or additionally, in some embodiments, server machine 200 includes one or more cooling air inlets and cooling fans (not shown). For example, in some embodiments, cooling air inlets and cooling fans enable air cooling of electronic components mounted on server motherboard 210, graphics cards 220, and/or thermal solutions 230.

To facilitate cooling of high-performance components of server motherboard 210 and/or graphics cards 220, server machine 200 further includes one or more thermal solutions 230. By directly cooling from server motherboard 210 and graphics cards 220, more heat can be transferred from server motherboard 210 and graphics cards 220. As a result, higher performance can be realized, for example via operating processors at higher speeds. Alternatively or additionally, the lifetime of various components of server motherboard 210 and graphics cards 220 can extended by operating such components below their nominal operating temperatures.

Each thermal solution 230 is a heat transfer apparatus or device that is coupled to a PCBA of server machine 200, and facilitates heat transfer away from one or more heat-generating electronic devices included in the PCBA. Examples of thermal solutions 230 include air-cooled thermal solutions, such as a heat sink with cooling fins, and water-cooled thermal solutions, such as a cooling plate or water block. In some embodiments, a thermal solution 230 that is coupled to a PCBA of server machine 200 may further include a phase change device, such as a vapor chamber, which spreads the heat generated by a PCBA over a wider surface area via an evaporator and condenser.

In the embodiment illustrated in FIG. 2, a separate water-cooled thermal solution 230 is coupled to each CPU 211, such as a cold plate 231. Each cold plate 231 is coupled to a particular CPU 211, and is configured to cool the particular CPU 211 by the flow of water or other cooling liquid through cold plate 231. As shown, cooling liquid lines 232 direct a cooling liquid into server machine 200, through each cold plate 231, and out of server machine 200, for example to a water chiller or other external heat exchange system.

In addition, in the embodiment illustrated in FIG. 2, a separate water-cooled thermal solution 230 is also coupled to each GPU card 220, such as a full-coverage cold plate 233. Each full-coverage cold plate 233 is coupled to a particular GPU card 220, and is configured to cool the particular GPU card 220 by the flow of water or other cooling liquid through cold plate 233. Unlike cold plates 231, full-coverage cold plates 233 can be configured to cool multiple heat-generating electronic devices of a GPU card 220 when coupled thereto. As shown, a cooling liquid line 234 directs a cooling liquid to a manifold 235 within server machine 200, and a cooling liquid line 236 directs a cooling liquid from manifold 235 out of server machine 200, for example to a water chiller or other external heat exchange system. Manifold 235 is fluidly coupled to the cold plate 233 of each GPU card 220, thereby enabling the liquid cooling of each GPU card 220. In some embodiments, manifold 235 includes a supply section (not shown) that fluidly couples each cold plate 233 to incoming cooling liquid line 234 and a return section (not shown) that fluidly couples each cold plate 233 to cooling liquid line 235.

Thermal solutions 230 are generally coupled to a PCBA as one step in the process of fabricating server machine 200. As noted previously, unlidded integrated circuit (IC) packages that are included in a PCBA are susceptible to damage during such a process. According to various embodiments, a PCBA that includes one or more unlidded IC packages further includes a vapor chamber that protects ICs included in such packages without the thermal resistance that is associated with the lid of a lidded IC package. One such embodiment is described below in conjunction with FIGS. 3 and 4.

PCBA with Vapor Chamber

Figure 3:
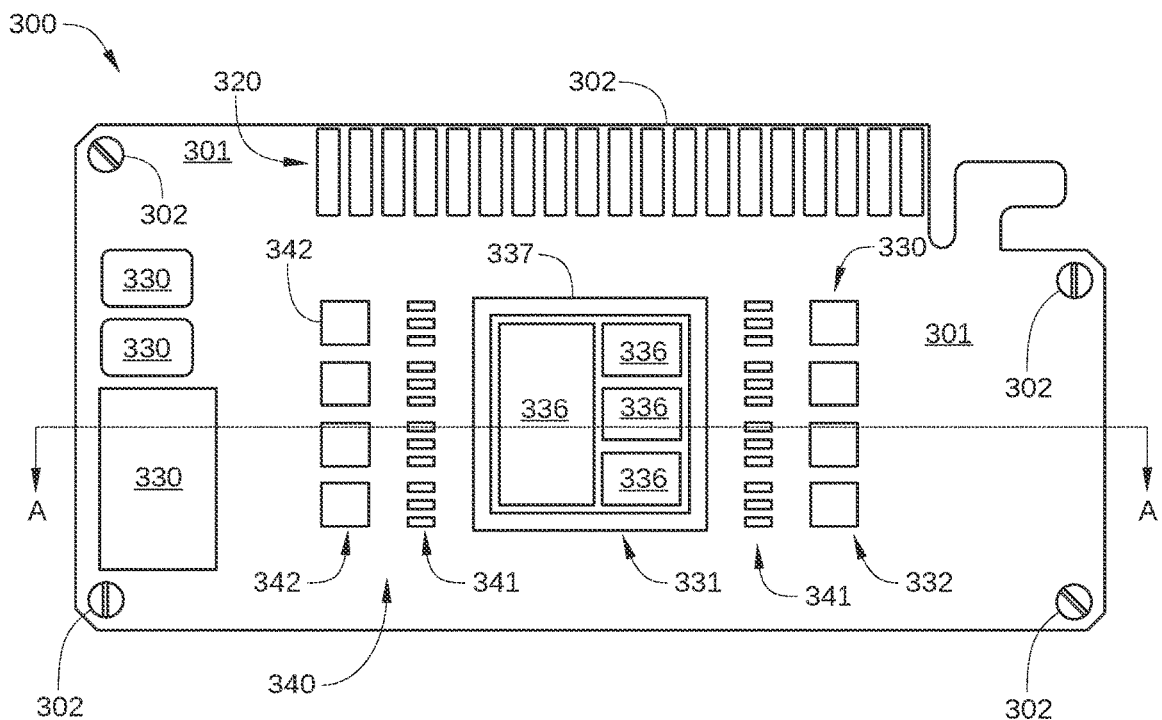
FIG. 3 is a schematic illustration of a PCBA that can be incorporated into the computer system of FIG. 1, according to various embodiments.
Figure 4:
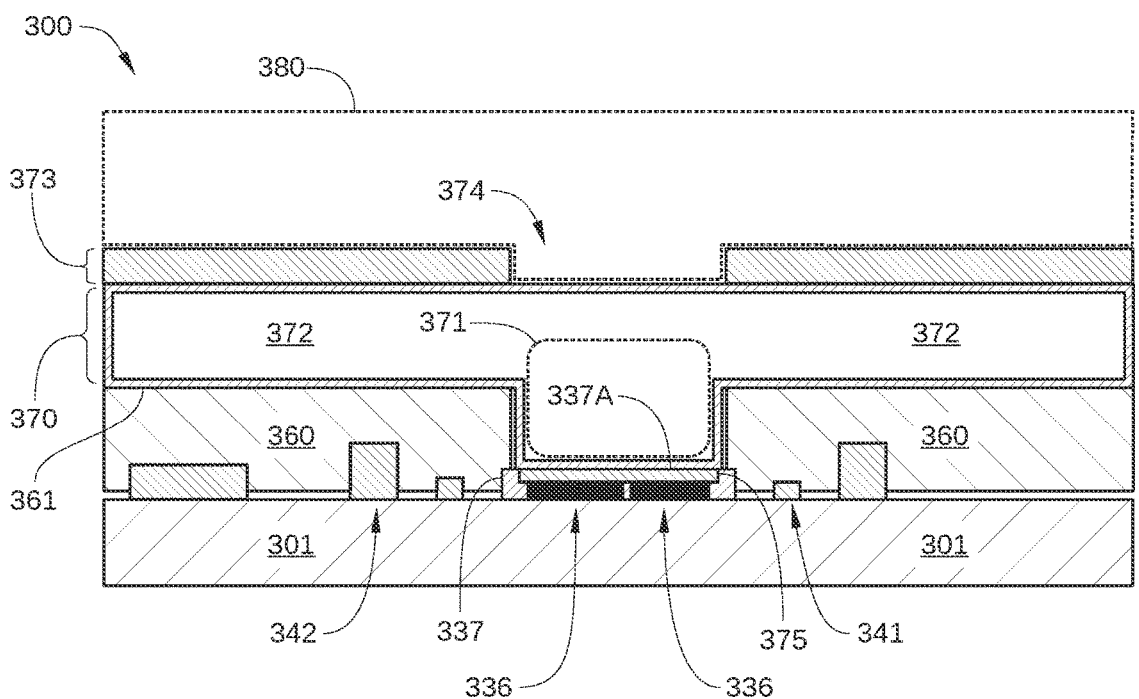
FIG. 4 is a cross-sectional view of the PCBA of FIG. 3, according to various embodiments.

FIG. 3 is a schematic illustration of a PCBA 300 that can be incorporated into computer system 100, according to various embodiments. FIG. 4 is a cross-sectional view of PCBA 300, according to various embodiments. The cross-sectional view of FIG. 4 is taken at section A-A of FIG. 3.

PCBA 300 is a PCB-based module or other PCB-based device and has multiple integrated circuits (ICs) 330 and/or electronic devices 340 included therein. In some embodiments, PCBA 300 is configured as an add-in card, such as a network interface controller, a graphics card (e.g., a GPU card 220 of FIG. 2), a CPU card, a single-board computer card, a server CPU card (e.g., server motherboard 210 of FIG. 2), a server storage card, and the like. In some embodiments, one or more of the functional modules of computer system 100 of FIG. 1 can be implemented as a PCB-based device using an embodiment of PCBA 300. In such embodiments, functional modules of computer system 100 so implemented include CPU 102, system memory 104, parallel processing subsystem 112, network adapter 118, and/or add-in cards 120 and 121. In some embodiments, multiple functional modules of computer system 100 are implemented as a single PCBA 300. Alternatively or additionally, in some embodiments, a single functional module of computer system 100 is implemented as a single PCBA 300.

PCBA 300 includes a PCB 301 on which various ICs 330 and electronic devices 340 are mounted. In some embodiments, PCB 301 further includes a plurality of edge connector pins 320 formed on an edge 302 of PCB 301. ICs 330 and/or electronic devices 340 may be communicatively coupled to edge connector pins 320 and/or each other by any technically feasible electrical connection known in the art, including a ball-grid array (BGA), a pin-grid array (PGA), wire bonding, electrical traces, vias, and/or the like. In the embodiment illustrated in FIG. 3, various ICs 330 and electronic devices 340 are mounted on a front side of PCB 301. In other embodiments, one or more ICs are also mounted on a back side of PCB 301, such as back-side-mounted memory devices.

PCB 301 is a rigid and electrically insulating substrate that provides PCBA 300 with structural rigidity and enables ICs 330 and electronic devices 340 to be integrated into a single module or device. Thus, PCB 301 enables PCBA 300 to be assembled as part of a server machine, such as server machine 200 in FIG. 2. For example, PCB 301 can be configured for insertion into a suitable interface or slot of a backplane, a peripheral component interconnect express (PCIe) slot of a motherboard, and/or the like. In some embodiments, PCB 301 includes a laminate substrate and is composed of a stack of insulative layers or laminates that are built up on the top and bottom surfaces of a core layer. The laminate substrate of PCB 301 can include any materials suitable for use in a PCB, including a phenolic paper substrate (e.g., FR-2, an epoxy paper substrate (e.g., CEM-1 and/or FR-3), an epoxy fiberglass board (e.g., FR-4, FR-5, G-10, and/or G-11), a non-woven glass fiber polyester substrate (e.g., FR-6), a PI polyacrylamide resin base material, and/or the like.

PCB 301 also provides an electrical interface, via electrical traces and vias (not shown), for routing input and output signals, power, and ground connections between ICs 330, electronic devices 340, and/or edge connector pins 320. Edge connector pins 320 provide electrical connections between the ICs 330 and electronic devices 340 of PCBA 300 and other devices external to PCBA 300, such as other PCB-based modules (not shown) of a computing device that includes PCBA 300. For example, such PCB-based modules may include one or more sound cards, graphics cards, network interface cards, and/or the like.

ICs 330 may include one or more processors, memory devices, a solid state drive (SSD), an SOC, and/or the like. The processor or processors can be a high-powered processor, such as CPU 102 and/or parallel processing subsystem 112 of FIG. 1, a CPU 211 or GPU of FIG. 2, or any other technically feasible processor or integrated circuit. In the embodiment illustrated in FIG. 3, ICs 330 include a high-power IC 331, such as a CPU or a GPU and a plurality of memory devices 332 mounted on the front side of PCB 301 proximate high-power IC 331. Electronic devices 340 may include one or more power regulators or other power-supplying devices, such as a plurality of capacitors 341 and/or a plurality of voltage regulator modules 342. Alternatively or additionally, in some embodiments, electronic devices 340 include other electronic devices mounted on a front side or back side of PCB 301, such as resistors, and/or the like.

High-power IC 331 includes one or more ICs 336 disposed within an IC package 337. To facilitate heat transfer from ICs 336, IC package 337 is an unlidded package. Therefore, ICs 336 are bare IC die that are disposed on an exposed surface 337A (shown in FIG. 4) of IC package 337. That is, IC package 337 does not include a lid that seals IC package 337 and protects ICs 336 from damage. Instead, IC package 337 is coupled to PCB 301 without a lid. According to various embodiments, a vapor chamber 370 is coupled to the IC package 337 to facilitate heat transfer from ICs and to protect ICs 336 during installation of PCBA 300 in a server machine or other computer system.

Vapor chamber 370 is configured to remove heat from one or more heat-generating devices, such as IC package 337, for example via an evaporator region 371. In some embodiments, vapor chamber 370 is further configured to distribute the heat generated by the one or more heat-generating device over a wider surface area than that of the heat-generating devices, for example via a condenser region 372 or condenser surface. Vapor chamber 370 is a sealed chamber, for example formed by copper plates, that includes an evaporative working fluid (not shown), such as water or alcohol. Vapor chamber 370 efficiently transfers heat, through a combination of evaporation and condensation, from IC package 337 to condenser region 372 to a thermal solution 380 (dashed lines) that is coupled to PCBA 300 when PCBA 300 is integrated into a server machine or other computer system. Cooling air (or any other cooling fluid) passes over the cooling fins (not shown) of thermal solution 380 to remove heat absorbed by thermal solution 380 from condenser region 372. Alternatively, in embodiments in which thermal solution 380 is a liquid-cooled thermal solution, cooling liquid passes through a cold plate of thermal solution 380 to remove heat absorbed by thermal solution 380 from condenser region 372.

In some embodiments, in vapor chamber 370, evaporation of the working fluid into a vapor takes place in evaporator portion 371, while condensation of the working fluid takes place in condenser region 372. As shown, evaporator region 371 is coupled to a surface of IC package 337 from which thermal energy is to be removed, such as exposed surface 337A. For example, in some embodiments, evaporator region 371 is coupled to exposed surface 337A of IC package 337 via a thermal interface material 375 that prevents contact between exposed surface 337A and a surface of vapor chamber 370 proximate evaporator region 371. Alternatively, in some embodiments, evaporator region 371 is coupled directly to exposed surface 337A of IC package 337. Thermal energy from IC package 337 is absorbed and the working fluid changes state into a vapor. The vapor then moves to condenser region 372 and condenses, releasing latent heat. In some embodiments, vapor chamber also includes a wicking structure or material (not shown) on some or all inner surfaces, to facilitate the return of condensed cooling liquid to evaporator region 371.

In some embodiments, condenser region 372 extends away from the surface from which the thermal energy is to be removed by evaporator portion 371. Thus, in such embodiments, heat transferred into evaporator portion 371 is distributed over a significantly greater surface area than the surface area of exposed surface 337A of IC package 337. As a result, thermal energy can be more efficiently transferred to thermal solution 380 from vapor chamber 370.

In the embodiment illustrated in FIG. 3, PCBA 300 further includes a thermal transfer plate 360 that is coupled to PCB 301, for example via threaded fasteners 302. In some embodiments, thermal transfer plate 360 is a stiffening member that provides PCBA 300 with structural rigidity. In addition, in some embodiments, thermal transfer plate 360 is configured to contact one or more of ICs 330 and/or electronic devices 340, so that heat generated by ICs 330 and/or electronic devices 340 can be distributed over a large heat-distribution surface 361 of thermal transfer plate 360. In such embodiments, heat-distribution surface 361 can contact a surface of vapor chamber 370, so that heat absorbed by thermal transfer plate 360 is transferred to vapor chamber 370. Further, in some embodiments, heat-distribution surface 361 of thermal transfer plate 360 provides a flat surface on which vapor chamber 370 can be supported. Thus, in such embodiments, vapor chamber 370 is not configured to couple to the complex "skyline" produced by ICs 330 and/or electronic devices 340 depicted in FIG. 4.

In some embodiments, vapor chamber 370 includes a stiffener member 373, such as a metallic plate. In such embodiments, stiffener member 373 comprises a mechanically rigid and thermally conductive material, such as aluminum and/or copper. In some embodiments, stiffener member 371 may be disposed between thermal solution 380 and vapor chamber 370. In such embodiments, stiffener member 373 has an opening 374 proximate evaporator region 371, so that a portion of thermal solution 380 can contact vapor chamber 370.

Alternative Embodiment of PCBA with Vapor Chamber

In the embodiment illustrated in FIGS. 3 and 4, vapor chamber 370 is coupled to a single IC 330 and/or electronic device 340 included in PCBA 300 via a single evaporator region 371. In other embodiments, a PCBA includes a vapor chamber that is coupled to multiple ICs and/or electronic devices. In such embodiments, the vapor chamber includes a different evaporator region for each IC or electronic device to which the vapor chamber is coupled. One such embodiment is described below in conjunction with FIG. 5.

Figure 5:
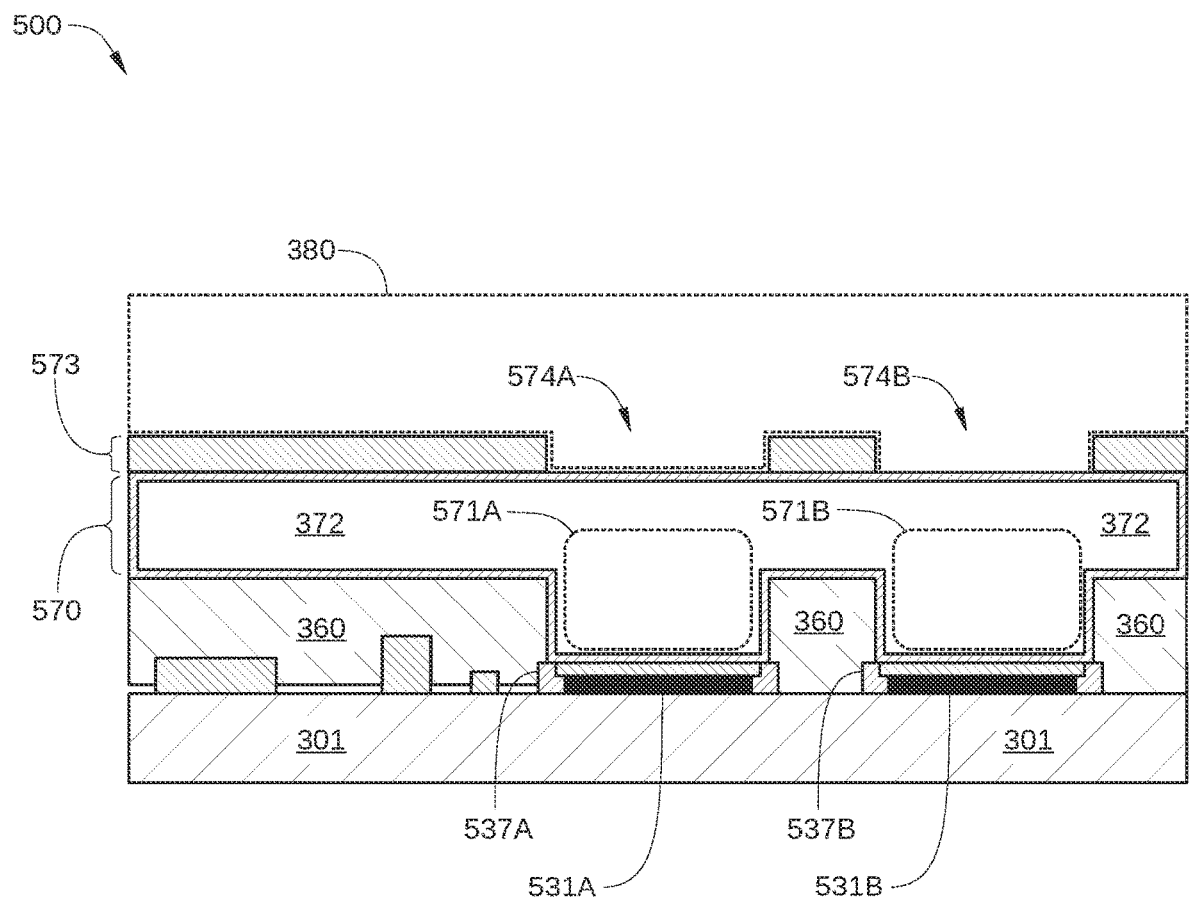
FIG. 5 is a cross-sectional view of a PCBA that can be incorporated into the computer system of FIG. 1, according to various other embodiments.

FIG. 5 is a cross-sectional view of a PCBA 500 that can be incorporated into computer system 100, according to various other embodiments. PCBA 500 is substantially similar in configuration to PCBA 300 of FIG. 3, except that PCBA 500 includes a vapor chamber 570 that is coupled to multiple IC packages and includes multiple evaporator regions 571A and 571B. As shown, evaporator region 571A is configured to remove thermal energy from a first high-power IC 531A, and evaporator region 571B is configured to remove thermal energy from a second high-power IC 531B. For example, in some embodiments, first high-power IC 531A and second high-power IC 531B can be CPUs, GPUs, or other heat-generating IC packages. Similar to high-power IC 331 of FIGS. 3 and 4, first high-power IC 531A is disposed within an unlidded IC package 537A, and second high-power IC 531B is disposed within an unlidded IC package 537B. In the embodiment illustrated in FIG. 5, a stiffener member 573 has multiple openings 574A and 574B, where opening 574A is proximate evaporator region 571A and opening 574A is proximate evaporator region 571B. Similarly, a thermal transfer plate 560 included in PCBA 500 includes multiple openings, so that vapor chamber 570 can contact unlidded IC package 537A and unlidded IC package 537B.

In the embodiment illustrated in FIG. 5, PCBA 500 includes a single vapor chamber that is coupled to multiple IC packages and includes multiple evaporator regions. In other embodiments, PCBA 500 includes a first vapor chamber that is coupled to first high-power IC 531A and a second vapor chamber that is coupled to second high-power IC 531B. In such embodiments, the first vapor chamber includes an evaporator region that is configured to remove thermal energy from first high-power IC 531A, and the second vapor chamber includes an evaporator region that is configured to remove thermal energy from second high-power IC 531B. Further, in such embodiments, thermal solution 380 can be coupled to both the first vapor chamber and the second vapor chamber, or a first thermal solution can be coupled to the first vapor chamber and a second thermal solution can be coupled to the second vapor chamber.

Alternative Embodiment of PCBA with Integrated Cold Plate and Vapor Chamber

In embodiments described above, a PCBA includes a vapor chamber that is coupled to one or more IC packages and/or electronic devices included in the PCBA. In other embodiments, a PCBA includes an integrated cold plate and vapor chamber that is coupled to IC packages and/or electronic devices included in the PCBA. In such embodiments, a cold plate for the PCBA is part of the PCBA, and is not coupled to the PCBA as part of the process of integrating the PBCA into a server machine or other computer system. One such embodiment is described below in conjunction with FIG. 6.

Figure 6:
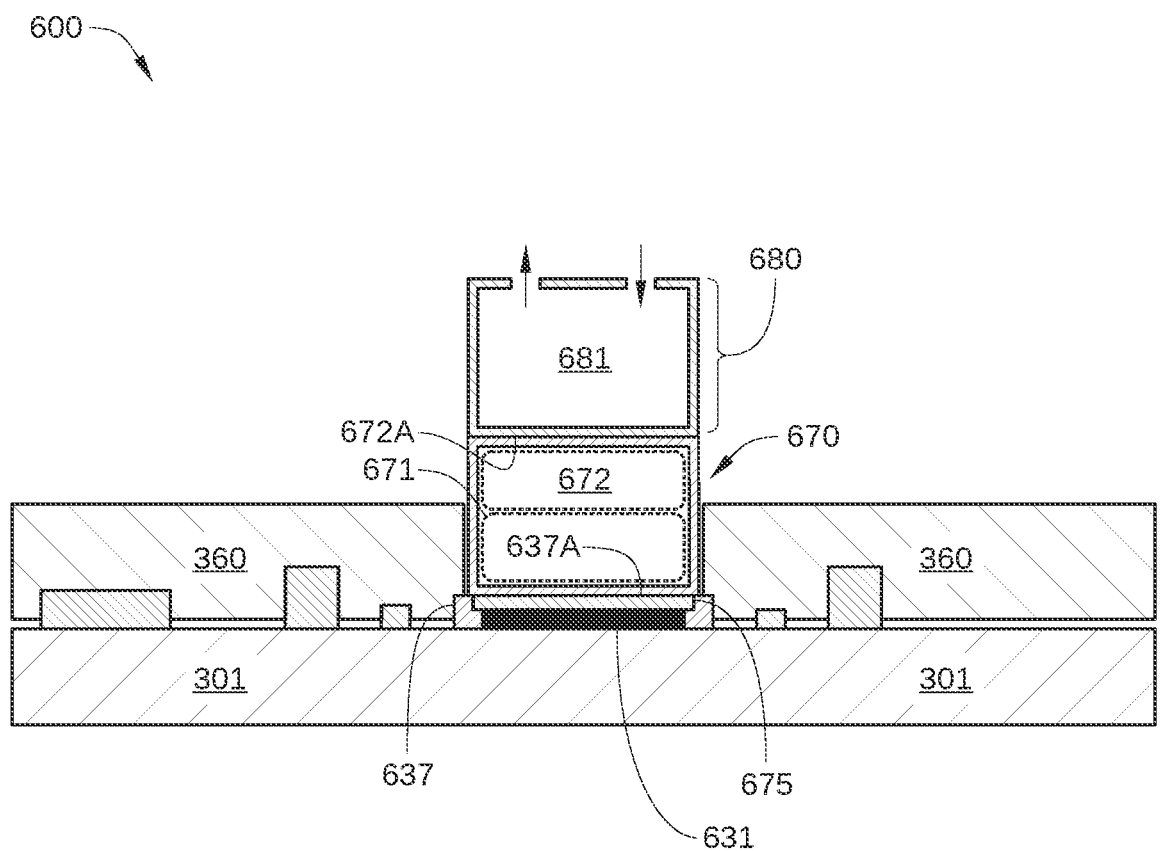
FIG. 6 is a cross-sectional view of a PCBA that can be incorporated into the computer system of FIG. 1, according to various other embodiments.

FIG. 6 is a cross-sectional view of a PCBA 600 that can be incorporated in computer system 100, according to various other embodiments. PCBA 600 is substantially similar in configuration to PCBA 300 of FIG. 3, except that PCBA 600 includes a vapor chamber 670 that is integrated with a cold plate 680. Thus, in such embodiments, vapor chamber 670 and cold plate 680 are both included in PCBA 600. As shown, vapor chamber 670 is coupled to an unlidded IC package 637, and evaporator region 671 of vapor chamber 670 is coupled to an exposed surface 637A of IC package 637. Similar to high-power IC 331 of FIGS. 3 and 4, high-power IC 631 is disposed within unlidded IC package 637. In some embodiments, evaporator region 671 is coupled to exposed surface 637A of IC package 637 via a thermal interface material 675 that prevents contact between exposed surface 637A and a surface of evaporator region 371.

Cold plate 680 is coupled to, bonded to, and/or mounted on a condenser surface 672A of vapor chamber 670. In some embodiments, cold plate 680 includes a heat exchange region 681 through which a cooling liquid flows. In such embodiments, heat exchange fins or other heat exchange features (not shown) may be disposed within heat exchange region 681 to facilitate the transfer of thermal energy from a condenser region 672 of vapor chamber 670 to the cooling liquid. In some embodiments, vapor chamber 670 and cold plate 680 are formed as a single assembly, for example by bonding multiple copper layers together to form evaporator region 671, condenser region 672, and heat exchange region 681.

In the embodiment illustrated in FIG. 6, PCBA 600 can be installed in or integrated into a server machine or other computer system without the added step of coupling a thermal solution to PCBA 600. Instead, PCBA is fluidly coupled to the liquid cooling liquid lines of the server machine or computer system, for example via a manifold similar to manifold 235 in FIG. 2.

In sum, the various embodiments shown and provided herein set forth a PCBA that includes one or more unlidded IC packages and a vapor chamber that is coupled to the one or more unlidded IC packages. The vapor chamber protects the bare die included in the unlidded IC packages during the process of integrating or installing the PCBA into a server machine or other computer system. In some embodiments, an different evaporator region of the vapor chamber is coupled to each of multiple unlidded IC package of the PCBA. Further, in some embodiments, the exposed surface of the vapor chamber provides a smooth, flat surface on which to mount a thermal solution, which facilitates the process of integrating the PCBA into a server machine or other computer system.

At least one technical advantage of the disclosed design relative to the prior art is that the disclosed design enables a thermal solution to be coupled to a PCBA that includes an unlidded IC package without the risk of damaging ICs within the unlidded IC package. Because the vapor chamber is coupled to the unlidded IC package during assembly of the PCBA, ICs within the unlidded IC package are protected in subsequent manufacturing processes. For example, during assembly of a server machine that includes such a PCBA, IC's within the unlidded IC package are protected from damage while the PCBA is manipulated, coupled to a thermal solution, and installed within the server machine. Thus, with the disclosed design, ICs within an unlidded IC package can have as much protection during server machine assembly as ICs within a lidded IC package. Further, with the disclosed design there is no increase in thermal resistance caused by a lid being disposed between the ICs and the thermal solution. These technical advantages provide one or more technological advancements over prior art approaches.

1. In some embodiments, a printed circuit board assembly includes: a printed circuit board (PCB); an integrated circuit (IC) package that is mounted on the PCB and includes a first surface and a bare IC die disposed on the first surface; and a vapor chamber coupled to the first surface of the IC package.

2. The printed circuit board assembly of clause 1, wherein the vapor chamber has at least two surfaces, wherein a first surface of the vapor chamber is coupled to the first surface of the IC package, and a second surface of the vapor chamber supports a thermal solution for the PCB assembly.

3. The printed circuit board assembly of clauses 1-2, further comprising a thermal interface material that is disposed between at least a portion of the first surface of the IC package and at least a portion of the first surface of the vapor chamber.

4. The printed circuit board assembly of any of clauses 1-3, wherein the thermal interface material prevents contact between the first surface of the IC package and the first surface of the vapor chamber.

5. The printed circuit board assembly of any of clauses 1-4, wherein the vapor chamber includes an evaporator region that is adjacent to the first surface of the vapor chamber.

6. The printed circuit board assembly of any of clauses 1-5, wherein the vapor chamber has a first surface that is coupled to the first surface of the IC package and a second surface that supports a stiffener member.

7. The printed circuit board assembly of any of clauses 1-6, wherein the vapor chamber has a first surface that is coupled to the first surface of the IC package and a second surface on which a stiffener member that is disposed.

8. The printed circuit board assembly of any of clauses 1-7, wherein the stiffener member includes an opening that exposes a portion of the second surface of the vapor chamber, and wherein the portion is proximate to an evaporator region of the vapor chamber.

9. The printed circuit board assembly of any of clauses 1-8, further comprising an additional IC package that is mounted on the PCB, wherein the additional IC package includes a second surface and the vapor chamber has a first surface that is coupled to the first surface of the IC package and a second surface that is coupled to the second surface of the additional IC package.

10. The printed circuit board assembly of any of clauses 1-9, wherein the vapor chamber includes a first evaporator region that is adjacent to the first surface of the vapor chamber and a second evaporator region that is adjacent to the second surface of the vapor chamber.

11. The printed circuit board assembly of any of clauses 1-10, wherein the vapor chamber includes a stiffener member that has at least a first opening proximate the first evaporator region and a second opening proximate the second evaporator region.

12. The printed circuit board assembly of any of clauses 1-11, further comprising: an additional IC package that is mounted on the PCB and includes at least a second surface; and an additional vapor chamber that is coupled to at least the second surface of the additional IC package.

13. The printed circuit board assembly of any of clauses 1-12, further comprising a thermal solution coupled to a first surface of the vapor chamber, wherein the vapor chamber comprises a second surface that is coupled to the first surface of the IC package.

14. The printed circuit board assembly of any of clauses 1-13, wherein the thermal solution and the vapor chamber are included in an assembly of metallic plates that are bonded together.

15. The printed circuit board assembly of any of clauses 1-14, wherein the thermal solution is bonded to the first surface of the vapor chamber.

16. In some embodiments, a computing system includes: a first printed circuit board assembly that includes: a printed circuit board (PCB); an integrated circuit (IC) package that is mounted on the PCB and includes a first surface and a bare IC die disposed on the first surface; and a vapor chamber coupled to the first surface of the IC package; and a first heat transfer apparatus coupled to a first surface of the vapor chamber.

17. The computing system of clause 16, wherein: the vapor chamber includes a second surface that opposes the first surface of the vapor chamber; and the vapor chamber is coupled to the first surface of the IC package via the second surface of the vapor chamber.

18. The computing system of clauses 16 or 17, further comprising a second PCB assembly that includes a second heat transfer apparatus, wherein the first heat transfer apparatus and the second heat transfer apparatus are fluidly coupled to each other.

19. The computing system of any of clauses 16-18, wherein the first heat transfer apparatus and the second heat transfer apparatus are fluidly coupled to each other via a manifold.

20. The computing system of any of clauses 16-19, wherein the first heat transfer device comprises an air-cooled heat sink.

Any and all combinations of any of the claim elements recited in any of the claims and/or any elements described in this application, in any fashion, fall within the contemplated scope of the present invention and protection.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

While the preceding is directed to embodiments of the present disclosure, other and further embodiments of the disclosure may be devised without departing from the basic scope thereof, and the scope thereof is determined by the claims that follow.

What is claimed is:

1. A printed circuit board assembly, comprising:
a printed circuit board (PCB);
an integrated circuit (IC) package that is mounted on the PCB and includes an exposed surface and a bare IC die disposed on the exposed surface;
an additional IC package that is mounted on the PCB and includes an additional surface; and
a vapor chamber has that includes a first surface that is coupled to the exposed surface of the IC package and a second surface that is coupled to the additional surface of the additional IC package, wherein the vapor chamber further includes a first evaporator region that is adjacent to the first surface and a second evaporator region that is adjacent to the second surface.

2. The printed circuit board assembly of claim 1, wherein a third surface of the vapor chamber supports a thermal solution for the PCB assembly.

3. The printed circuit board assembly of claim 1, further comprising a thermal interface material that is disposed between at least a portion of the exposed surface of the IC package and at least a portion of the first surface of the vapor chamber.

4. The printed circuit board assembly of claim 3, wherein the thermal interface material prevents contact between the exposed surface of the IC package and the first surface of the vapor chamber.

5. The printed circuit board assembly of claim 1, wherein the vapor chamber has a third surface that supports a stiffener member.

6. The printed circuit board assembly of claim 1, wherein the vapor chamber has a third surface on which a stiffener member is disposed.

7. The printed circuit board assembly of claim 6, wherein the stiffener member includes an opening that exposes a portion of the third surface of the vapor chamber, and wherein the portion is proximate to an evaporator region of the vapor chamber.

8. The printed circuit board assembly of claim 1, wherein the vapor chamber further includes a stiffener member that has at least a first opening proximate the first evaporator region and a second opening proximate the second evaporator region.

9. The printed circuit board assembly of claim 1, further comprising:
a third IC package that is mounted on the PCB and includes at least a third surface; and
an additional vapor chamber that is coupled to at least the third surface of the third IC package.

10. The printed circuit board assembly of claim 1, further comprising a thermal solution coupled to a third surface of the vapor chamber.

11. The printed circuit board assembly of claim 10, wherein the thermal solution and the vapor chamber are included in an assembly of metallic plates that are bonded together.

12. The printed circuit board assembly of claim 10, wherein the thermal solution is bonded to the third surface of the vapor chamber.

13. A computing system, comprising:
a first printed circuit board assembly that includes:
a printed circuit board (PCB);
an integrated circuit (IC) package that is mounted on the PCB and includes an exposed surface and a bare IC die disposed on the exposed surface; and
an additional IC package that is mounted on the PCB and includes an additional surface; and
a vapor chamber that includes a first surface that is coupled to the exposed surface of the IC package and a second surface that is coupled to the additional surface of the additional IC package, wherein the vapor chamber further includes a first evaporator region that is adjacent to the first surface and a second evaporator region that is adjacent to the second surface.

14. The computing system of claim 13, further comprising a first heat transfer apparatus coupled to a third surface of the vapor chamber, wherein:
the third surface of the vapor chamber opposes the first surface of the vapor chamber.

15. The computing system of claim 13, further comprising a first heat transfer apparatus coupled to a third surface of the vapor chamber and a second PCB assembly that includes a second heat transfer apparatus, wherein the first heat transfer apparatus and the second heat transfer apparatus are fluidly coupled to each other.

16. The computing system of claim 15, wherein the first heat transfer apparatus and the second heat transfer apparatus are fluidly coupled to each other via a manifold.

17. The computing system of claim 13, further comprising a first heat transfer apparatus coupled to a third surface of the vapor chamber, wherein the first heat transfer apparatus comprises an air-cooled heat sink.

* * * * *

UNITED STATES PATENT AND TRADEMARK OFFICE
CERTIFICATE OF CORRECTION

PATENT NO. : 12,219,691 B2  
APPLICATION NO. : 17/728731  
DATED : February 4, 2025  
INVENTOR(S) : David Haley, James Stephen Fields, Jr. and Seungkug Park Page 1 of 1

It is certified that error appears in the above-identified patent and that said Letters Patent is hereby corrected as shown below:

In the Claims

Column 13, Claim 1, Line 53, please delete "has".

Signed and Sealed this  
Eighth Day of April, 2025

Coke Morgan Stewart  
*Acting Director of the United States Patent and Trademark Office*